(12) United States Patent
Sugiyama

(10) Patent No.: US 7,252,886 B2
(45) Date of Patent: Aug. 7, 2007

(54) CURABLE COMPOSITION AND PROCESS FOR PRODUCING CURED FLUORINATED PRODUCT

(75) Inventor: Norihide Sugiyama, Yokohama (JP)

(73) Assignee: Asahi Glass Company, Limited, Tokyo (JP)

(*) Notice: Subject to any disclaimer, the term of this patent is extended or adjusted under 35 U.S.C. 154(b) by 0 days.

(21) Appl. No.: 11/507,672

(22) Filed: Aug. 22, 2006

(65) Prior Publication Data

US 2006/0281883 A1 Dec. 14, 2006

Related U.S. Application Data

(63) Continuation of application No. PCT/JP2005/003905, filed on Mar. 7, 2005.

(30) Foreign Application Priority Data

Mar. 8, 2004 (JP) .............................. 2004-063990

(51) Int. Cl.
*B32B 27/32* (2006.01)
*C08F 36/16* (2006.01)

(52) U.S. Cl. ...................... 428/422; 428/421; 526/242; 526/252; 526/266; 549/448

(58) Field of Classification Search ................ 526/252, 526/266, 242; 428/421, 422; 529/448
See application file for complete search history.

(56) References Cited

U.S. PATENT DOCUMENTS

| | | | | |
|---|---|---|---|---|
| 3,380,983 A | * | 4/1968 | Siegart et al. ............... | 428/375 |
| 3,505,411 A | * | 4/1970 | Rice ............................ | 568/615 |
| 3,668,233 A | * | 6/1972 | Pavlik ......................... | 560/25 |
| 3,816,553 A | | 6/1974 | Smart et al. | |
| 3,849,504 A | * | 11/1974 | Mitsch ........................ | 568/615 |
| 3,981,928 A | * | 9/1976 | Pavlik ......................... | 568/677 |
| 5,037,917 A | * | 8/1991 | Babb et al. .................. | 526/242 |
| 5,080,508 A | | 1/1992 | Onishi et al. | |
| 5,498,657 A | * | 3/1996 | Sugiyama et al. .......... | 524/463 |
| 5,502,132 A | * | 3/1996 | Sugiyama et al. .......... | 526/247 |
| 5,648,566 A | | 7/1997 | Krueger et al. | |
| 6,111,062 A | * | 8/2000 | Shirota et al. .............. | 524/402 |
| 6,221,987 B1 | * | 4/2001 | Sugiyama .................... | 526/231 |
| 6,448,452 B2 | * | 9/2002 | Kashiwagi et al. ......... | 568/683 |
| 2003/0146103 A1 | | 8/2003 | Okazoe et al. | |
| 2004/0230018 A1 | | 11/2004 | Okazoe et al. | |
| 2006/0183875 A1 | * | 8/2006 | Sugiyama et al. .......... | 526/242 |

FOREIGN PATENT DOCUMENTS

| | | |
|---|---|---|
| JP | 50-46642 | 4/1975 |
| JP | 60-104092 | 6/1985 |
| JP | 2-84456 | 3/1990 |
| JP | 2-129254 | 5/1990 |
| JP | 8-505376 | 6/1996 |
| JP | 2000-1511 | 1/2000 |
| JP | 2003-8073 | 1/2003 |
| WO | 02/10106 | 2/2002 |
| WO | 02/46811 | 6/2002 |
| WO | 03/037885 | 5/2003 |
| WO | 2005/037818 | 4/2005 |

* cited by examiner

*Primary Examiner*—Randy Gulakowski
*Assistant Examiner*—John J. Figueroa
(74) *Attorney, Agent, or Firm*—Oblon, Spivak, McClelland, Maier & Neustadt, P.C.

(57) ABSTRACT

To provide a curable composition which gives a cured fluorinated product excellent in transparency, light resistance (particularly against a short wavelength light having a wavelength of from 200 to 500 nm) and heat resistance, and having a controlled volume particularly thickness.

A curable composition which contains a perfluorocyclic polyene having alicyclic structures which comprise carbon atoms and which may contain an oxygen atom and having at least two carbon-carbon double bonds, at least one of which is a polymerizable carbon-carbon double bond in which at least one of the two carbon atoms forming the polymerizable carbon-carbon double bond is a carbon atom forming the alicyclic structure, and a polymerization initiator; a cured fluorinated product obtained by curing the curable composition; an optical material made of the cured fluorinated product; and a light emitting device encapsulated with the cured fluorinated product in a light-transmitting manner.

10 Claims, 1 Drawing Sheet

CURABLE COMPOSITION AND PROCESS FOR PRODUCING CURED FLUORINATED PRODUCT

TECHNICAL FIELD

The present invention relates to a curable composition which contains a perfluorocyclic polyene having a polymerizable carbon-carbon double bond in an alicyclic structure and a polymerization initiator, a process for producing a cured fluorinated product which comprises curing the perfluorocyclic polyene, an optical material made of the cured fluorinated product, and a light emitting device encapsulated with the cured fluorinated product in a light-transmitting manner.

BACKGROUND ART

An illumination light source comprising a light emitting device (hereinafter referred to as white LED) which emits white light by wavelength conversion of a phosphor by means of a light emitting diode (hereinafter referred to as LED) emitting light having a wavelength of 460 nm (blue), 405 nm (violet) or 380 nm (ultraviolet) encapsulated with an epoxy type transparent resin in a light-transmitting manner has a problem in poor durability since the transparent resin will deteriorate by light and heat of the white LED.

On the other hand, a fluoropolymer having a fluorinated alicyclic structure in its main chain has low refractive index properties and low surface energy properties, is excellent in transparency, light resistance (especially durability against a short wavelength light), chemical resistance, etc., and can be dissolved in a specific solvent. Therefore, a method of applying the fluoropolymer to an adhesive or coating agent to form a coating film having the above properties in various fields has been developed (see Patent Documents 1 and 2). Use of a coating film formed from a coating agent as disclosed in Patent Document 2 as a transparent resin for encapsulating a white LED in a light-transmitting manner has also been proposed (see Patent Document 3).

However, in the coating agent as disclosed in Patent Document 3, the concentration of the fluoropolymer is at a level of 25 mass % at the highest, whereby a thickness (at least 100 µm) required for encapsulating LED in a light-transmitting manner will not be obtained. It is possible to increase the thickness by applying the coating agent a plurality of times, but cracks are likely to occur in the coating film by recoating, thus lowering the yield.

Further, a process has been proposed to produce a molded product having high transparency to ultraviolet rays and excellent in transparency by bulk polymerization of a fluoropolymer such as perfluoro(2,2-dimethyl-1,3-dioxole) or perfluoro(butenyl vinyl ether)by means of a polymerization initiator comprising a fluorinated organic peroxide (see Patent Document 4). However, a polymer of the fluoromonomer is a thermoplastic linear monomer and has not necessarily sufficient heat resistance. Further, the fluoromonomer has a low boiling point and if the bulk polymerization is carried out in an open system, the fluoromonomer will volatilize, whereby it will be difficult to control the volume of the molded product.

Patent Document 1: JP-A-2-84456
Patent Document 2: JP-A-2-129254
Patent Document 3: JP-A-2003-8073
Patent Document 4: JP-A-2000-1511

DISCLOSURE OF THE INVENTION

Object to be Accomplished by the Present Invention

The present invention has been made to solve the above problems, and it is an object of the present invention to provide a curable composition containing a multifunctional perfluoromonomer which gives a cured fluorinated product excellent in transparency, light resistance particularly against a short wavelength light (hereinafter referred to simply as a short wavelength light) having a wavelength of from 200 to 500 nm, heat resistance and mechanical properties, and having a controlled volume (particularly thickness).

Means to Accomplish the Object

Namely, the present invention provides the following subject matters.

1. A curable composition which contains a perfluorocyclic polyene having alicyclic structures which comprise carbon atoms and which may contain an oxygen atom and having at least two carbon-carbon double bonds, at least one of which is a polymerizable carbon-carbon double bond in which at least one of the two carbon atoms forming the polymerizable carbon-carbon double bond is a carbon atom forming the alicyclic structure; and a polymerization initiator.
2. The curable composition according to the above 1, wherein the perfluorocyclic polyene is a perfluorocyclic diene which has alicyclic structures comprising a 5-membered or 6-membered ring containing one or two oxygen atoms, in which a carbon-carbon double bond is present between adjacent two carbon atoms constituting the alicyclic structure or a carbon-carbon double bond is present between one carbon atom constituting the alicyclic structure and a carbon atom outside the alicyclic structure, and which has two alicyclic structures having such a carbon-carbon double bond.
3. The curable composition according to the above 1 or 2, which further contains a perfluorocyclic monoene having at least 8 carbon atoms, having an alicyclic structure which comprises carbon atoms and which may contain an oxygen atom, and having one polymerizable carbon-carbon double bond in which at least one of the two carbon atoms forming the polymerizable carbon-carbon double bond is a carbon atom forming the alicyclic structure.
4. The curable composition according to the above 3, wherein the perfluorocyclic monoene is a perfluorocyclic monoene which has an alicyclic structure comprising a 5-membered or 6-membered ring containing one or two oxygen atoms, and in which a carbon-carbon double bond is present between adjacent two carbon atoms constituting the alicyclic structure or a carbon-carbon double bond is present between one carbon atom constituting the alicyclic structure and a carbon atom outside the alicyclic structure.
5. An optical material made of a cured fluorinated product obtained by curing the curable composition as defined in any one of the above 1 to 4.
6. A light emitting device encapsulated with a cured fluorinated product obtained by curing the curable composition as defined in any one of the above 1 to 4 in a light-transmitting manner.
7. A process for producing a cured fluorinated product, which comprises curing a perfluorocyclic polyene having alicyclic structures which comprise carbon atoms and which may contain an oxygen atom and having at least two carbon-carbon double bonds, at least one of which is a polymerizable carbon-carbon double bond in which at least one of the two carbon atoms forming the polymerizable carbon-carbon double bond is a carbon atom forming the alicyclic structure, or the perfluorocyclic polyene and a copolymerizable monomer other than the perfluorocyclic polyene.

8. The process for producing a cured fluorinated product according to the above 7, wherein the curing is carried out by the action of a polymerization initiator.

9. An optical material made of a cured fluorinated product obtained by the process as defined in the above 7 or 8.

10. A light emitting device encapsulated with a cured fluorinated product obtained by the process as defined in the above 7 or 8 in a light-transmitting manner.

EFFECTS OF THE INVENTION

A cured fluorinated product which is a cured product of a perfluorocyclic polyene in the present invention is excellent in transparency and light resistance (particularly durability against a short wavelength light) and is an insoluble and infusible crosslinked polymer and is thereby excellent in heat resistance and mechanical properties. Further, since the curable composition of the present invention contains a perfluorocyclic polyene having a high boiling point, even when cured in an open system, it will give a cured fluorinated product with a high yield, and a cured fluorinated product having a thickness of at least 100 μm can readily be formed.

MEANINGS OF SYMBOLS

Figure 1:
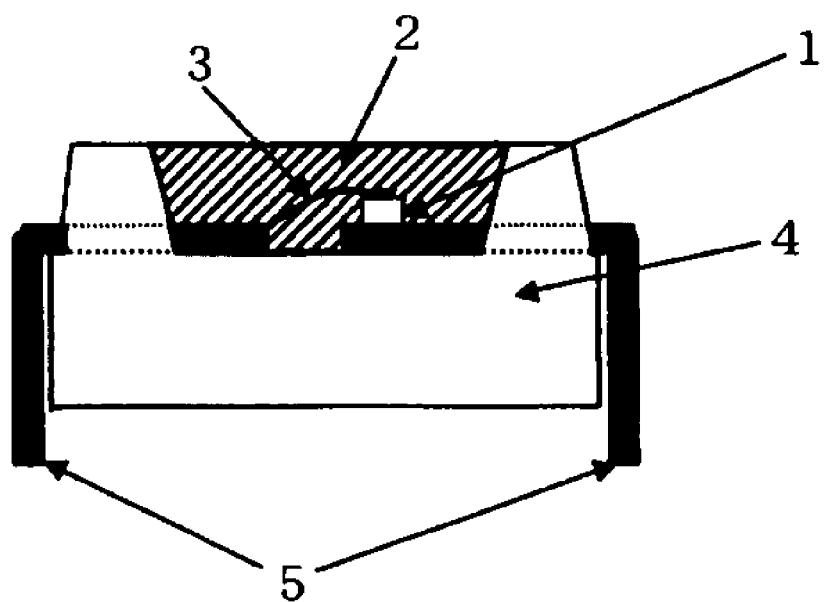
FIG. 1 is a cross-section illustrating an LED chip which is one example of a light emitting device of the present invention.

1: LED chip
2: encapsulating resin
3: bonding wire
4: housing
5: lead frame

BEST MODE FOR CARRYING OUT THE INVENTION

In this specification, a compound represented by a formula (a) will be referred to as a compound (a). The same applies to compounds and units represented by other formulae.

In this specification, encapsulation in a light-transmitting manner means encapsulation by which an object is encapsulated while light is transmitted therethrough.

In this specification, a unit means a unit derived from a monomer formed by the monomer being cured. Further, a group having a carbon atom chain such as a perfluoroalkyl group, a perfluoroalkylene group or a perfluoroalkoxy group may be linear or branched.

In the present invention, a perfluoromonomer (a perfluorocyclic polyene and a perfluorocyclic monoene) "having an alicyclic structure which comprises carbon atoms and may contain an oxygen atom and having at least one polymerizable carbon-carbon double bond, at least one of the two carbon atoms forming the polymerizable carbon-carbon double bond is a carbon atom forming the alicyclic structure" will generically be referred to as a perfluorocyclic monomer. The number of carbon atoms in the perfluorocyclic monomer is preferably at least 6, particularly preferably at least 8 from the viewpoint of the boiling point of the monomer and heat resistance of the resulting cured fluorinated product, and the upper limit is preferably 24, particularly preferably 18. A perfluorocyclic monomer which satisfies this requirement has a boiling point of at least about 100° C. and is preferred for curing in an open system as described hereinafter.

The alicyclic structure in the perfluorocyclic monomer is an alicyclic structure made of carbon atoms alone or carbon atoms and an oxygen atom as constituent atoms, and the number of the constituent atoms is preferably from 4 to 8 atoms, particularly preferably 5 or 6 atoms. Particularly preferred is an alicyclic structure which is a 5- or a 6-membered ring containing one or two oxygen atoms. The perfluorocyclic monomer has at least one such alicyclic structure, and particularly preferably has one or two such alicyclic structures. In a case where it has two or more alicyclic structures, the two or more alicyclic rings may be connected by a single bond or a bivalent or higher valent connecting group, or may be condensed (including a case where one carbon atom is shared). The connecting group may, for example, be an oxygen atom, a perfluoroalkylene group (preferably having at most 8 carbon atoms) or a perfluoroalkylene group (preferably having at most 8 carbon atoms) having an etheric oxygen atom at one end or both ends or between carbon atoms.

To the carbon atom constituting the alicyclic ring, a substituent other than a fluorine atom may be bonded. The substituent may, for example, be preferably a perfluoroalkyl group having at most 15 carbon atoms, a perfluoroalkyl group having at most 15 carbon atoms and having an etheric oxygen atom (provided that it may have two or more etheric oxygen atoms) between carbon atoms, a perfluoroalkoxy group having at most 15 carbon atoms, or a perfluoroalkoxy group having at most 15 carbon atoms and having an etheric oxygen atom (provided that it may have two or more etheric oxygen atoms) between carbon atoms.

The perfluorocyclic monomer contains a carbon-carbon double bond in which at least one of the two carbon atoms forming the polymerizable carbon-carbon double bond is a carbon atom forming the alicyclic structure. Namely, a carbon-carbon double bond is present between adjacent two carbon atoms constituting the alicyclic structure, or a carbon-carbon double is present between one carbon atom forming the alicyclic structure and a carbon atom outside the alicyclic structure. One alicyclic structure may have at least two such carbon-carbon double bonds, but usually one alicyclic structure has one carbon-carbon double bond. Accordingly, a perfluorocyclic monomer (one type of a perfluorocyclic polyene) having at least two such carbon-carbon double bonds is preferably a compound having at least two alicyclic structures each having such a carbon-carbon double bond (hereinafter sometimes referred to as alicyclic structure united with a carbon-carbon double bond). Here, a compound having a structure is such that at least two such alicyclic rings are condensed or at least two such alicyclic rings and another ring are condensed, is regarded as a compound having a structure having at least two alicyclic rings united with a carbon-carbon double bond, and a compound having a structure such that one such an alicyclic ring and another ring are condensed, is regarded as a compound having a structure having one alicyclic ring united with a carbon-carbon double bond.

The perfluorocyclic monomer has at least one alicyclic structure united with a carbon-carbon double bond, and may further have a carbon-carbon double bond other than this structure (a carbon-carbon double bond in which neither of the two carbon atoms is a carbon atom forming the alicyclic ring).

The perfluorocyclic polyene in the present invention preferably has 2 to 4 such carbon-carbon double bonds (at least one of which is a carbon-carbon double bond united with an alicyclic structure), and particularly preferred is a perfluorocyclic polyene having two carbon-carbon double bonds united with an alicyclic structure (containing no other polymerizable carbon-carbon double bond). Hereinafter, a perfluorocyclic polyene having two carbon-carbon double bonds united with an alicyclic structure will sometimes be referred to as a perfluorocyclic diene.

Further, the perfluorocyclic monoene represents a perfluorocyclic monomer having one carbon-carbon double bond united with an alicyclic structure (containing no other polymerizable carbon-carbon double bond). The perfluorocyclic monoene is preferably a perfluorocyclic monoene having a relatively high boiling point, and particularly preferably a perfluorocyclic monoene having at least 6, particularly at least 8 and at most 18 carbon atoms. A perfluorocyclic monomer which satisfies this requirement has a boiling point of at least about 100° C. and is preferred for curing in an open system as described hereinafter.

The alicyclic structure having a carbon-carbon double bond united therewith is preferably a perfluoro(2-methylene-1,3-dioxolane) structure or a perfluoro-1,3-dioxole structure.

The perfluorocyclic diene is preferably a compound having two perfluoro(2-methylene-1,3-dioxolane) structures, particularly preferably a compound (the following compound (a)) having two rings connected at the 4-positions by means of a single bond or a bivalent connecting group or a compound (the following compound (b) having two rings condensed at the 4- and the 5-positions each by means of a single bond or a bivalent connecting group. The following compound (g) may be mentioned as another perfluorocyclic diene.

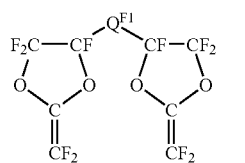
(a)

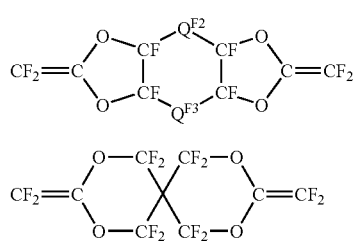
(b)

(g)

In the above formulae, $Q^{F1}$ is a single bond, an oxygen atom or a $C_{1-10}$ perfluoroalkylene group which may have an etheric oxygen atom, and each of $Q^{F2}$ and $Q^{F3}$ which are independent of each other, is a single bond, an oxygen atom or a $C_{1-5}$ perfluoroalkylene group which may have an etheric oxygen atom.

The perfluorocyclic monoene is preferably a perfluoro(2-methylene-1,3-dioxolane) (the following compound (c)) having a substituent such as a perfluoroalkyl group which may contain an etheric oxygen atom on at least one of the 4- and the 5-positions or a perfluoro-1,3-dioxole (the following compound (d)) having one or two monovalent substituents such as a perfluoroalkyl group at the 2-position or having a bivalent substituent such as a perfluoroalkylene group which may have an etheric oxygen atom at the 2-position.

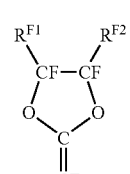
(c)

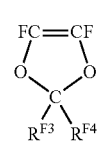
(d)

In the above formulae, each of $R^{F1}$ and $R^{F2}$ which are independent of each other, is a fluorine atom, or a $C_{1-14}$ perfluoroalkyl group which may have an etheric oxygen atom, provided that at least one of $R^{F1}$ and $R^{F2}$ is the above perfluoroalkyl group, and the sum of carbon atoms in $R^{F1}$ and carbon atoms in $R^{F2}$ is 4 or more. Further, $R^{F1}$ and $R^{F2}$ together may form a $C_{4-14}$ perfluoroalkyl group which may have an etheric oxygen atom. It is preferred is that $R^{F1}$ is a fluorine atom and $R^{F2}$ is a $C_{4-14}$ perfluoroalkyl group which may have an etheric oxygen atom.

Each of $R^{F3}$ and $R^{F4}$ which are independent of each other, is a fluorine atom, or a $C_{1-15}$ perfluoroalkyl group which may have an etheric oxygen atom, provided that at least one of $R^{F3}$ and $R^{F4}$ is the above perfluoroalkyl group, and the sum of carbon atoms in $R^{F3}$ and carbon atoms in $R^{F4}$ is at least 5. $R^{F3}$ and $R^{F4}$ together may form a $C_{5-15}$ perfluoroalkylene group which may have an etheric oxygen atom. It is preferred that $R^{F3}$ is a trifluoromethyl group and $R^{F4}$ is a $C_{4-14}$ perfluoroalkyl group which may have an etheric oxygen atom.

The following compounds may be mentioned as specific examples of the compound (a). A process for producing the compound (a) will be described hereinafter.

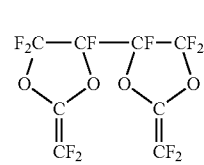 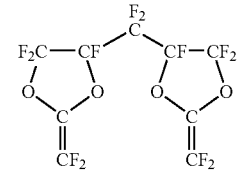

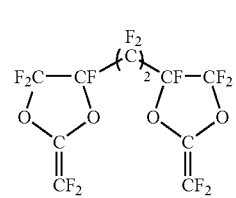 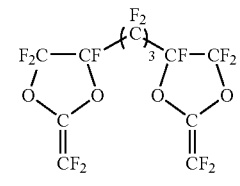

-continued

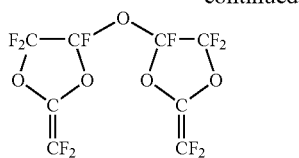

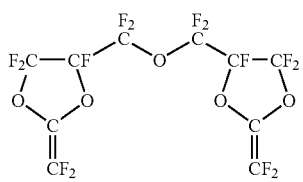

The compound (c) is preferably the following compound (ca) or (cb), wherein $R^{Fa}$ is a $C_{4-14}$ perfluoroalkyl group, and $R^{Fb}$ is a $C_{4-14}$ perfluoro(alkoxyalkyl) group, and the same applies hereinafter.

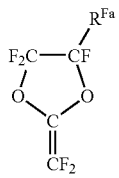

(ca)

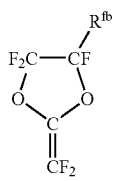

(cb)

The following compounds may be mentioned as specific examples of the compound (ca). The compound (ca) is preferably produced by a process as disclosed in JP-A-5-213929 or JP-A-5-339255.

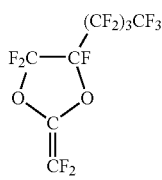 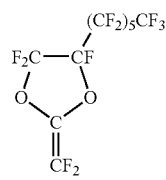

The following compounds may be mentioned as specific examples of the compound (cb). A process for producing the compound (cb) will be described hereinafter.

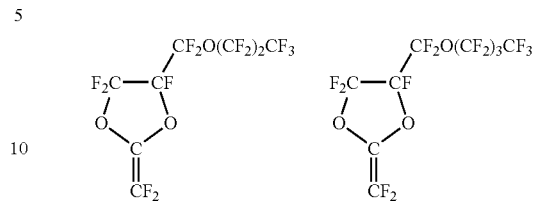

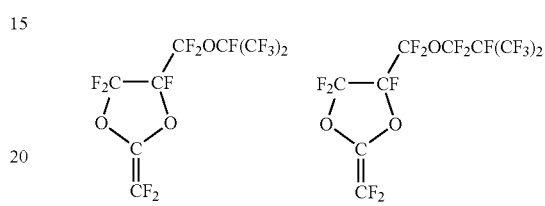

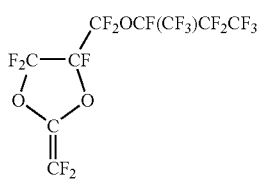

The following compounds may be mentioned as specific examples of the compound (d). The following compounds (da) and (db) are preferably produced by a process as disclosed in JP-A-4-346989 or WO04/088422.

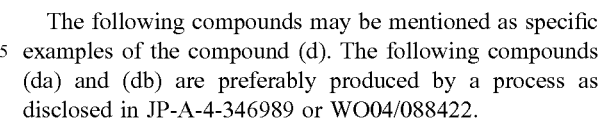
(da)

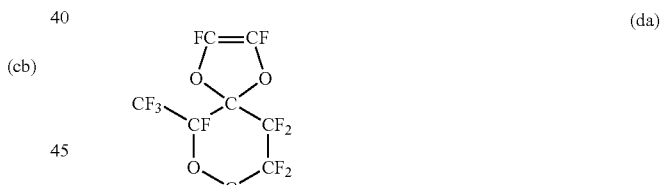
(db)

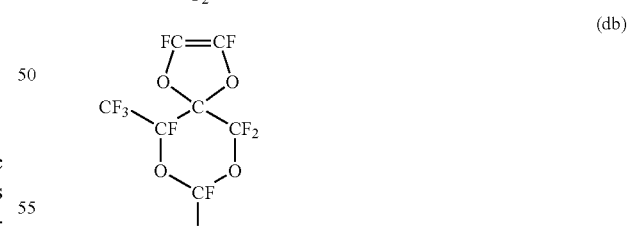

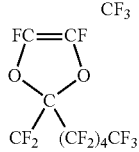

The compound (a) may be obtained by the following production process (wherein $Q^1$ is a group corresponding to $Q^{F1}$ and is a single bond, an oxygen atom or a $C_{1-10}$ alkylene group which may have an etheric oxygen atom).

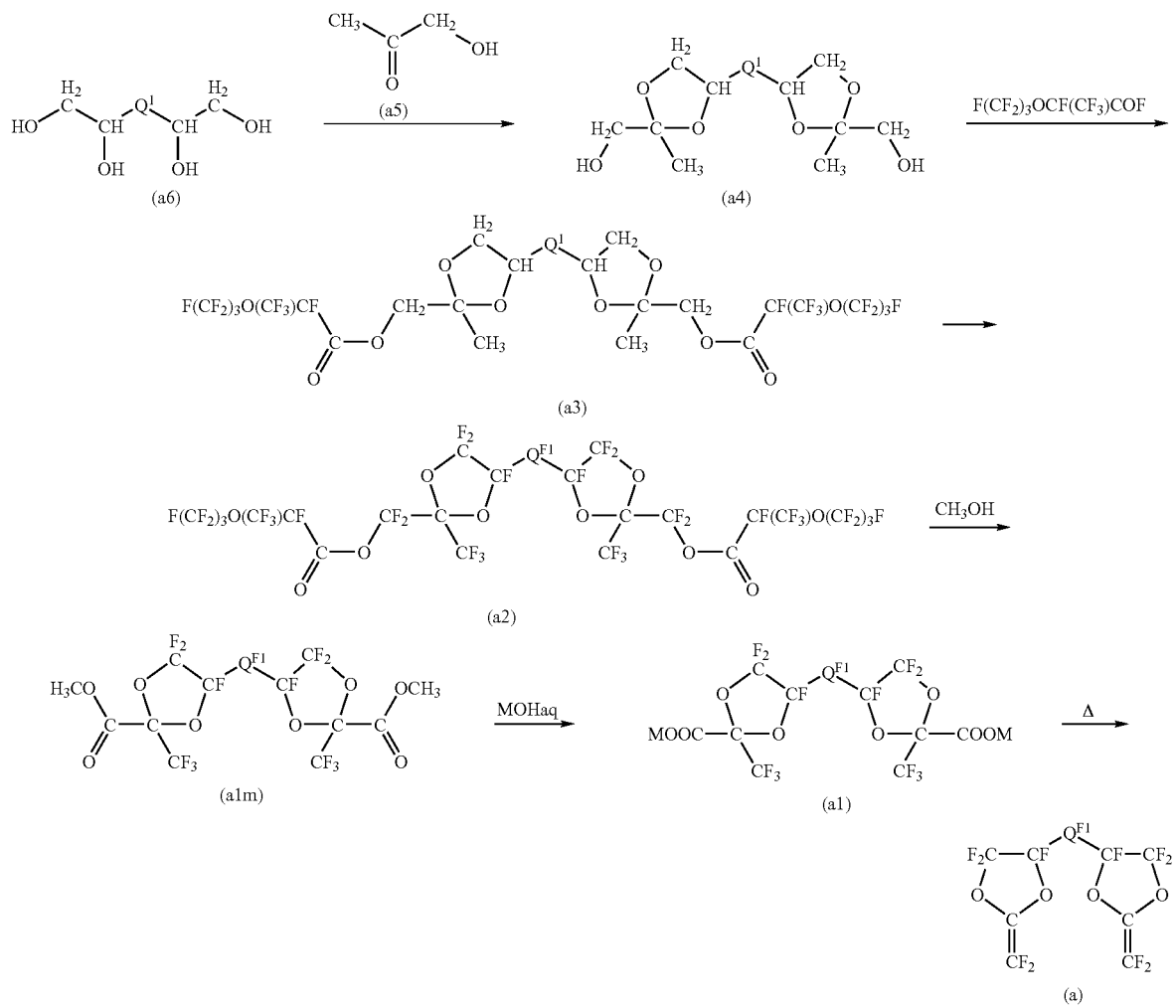

Namely, the compound (a) can be produced in such a manner that compounds (a6) and (a5) are subjected to acetalization to obtain compound (a4), the resulting compound (a4) and F (CF$_2$) $_3$OCF (CF$_3$) COF are subjected to esterification to obtain compound (a3), which is subjected to fluorination in a liquid phase to obtain compound (a2), which is reacted with CH$_3$OH to obtain compound (a1m), which is hydrolyzed in a solution containing MOH (wherein M is a potassium atom or a sodium atom, the same applies hereinafter) to obtain compound (a1), which is pyrolyzed to obtain the compound (a).

The compound (a6) can be obtained by oxidizing and hydrolyzing a compound represented by the following formula (a7) which is a corresponding diene (wherein Q$^1$ is as defined above).

$$CH_2=CHQ^1CH=CH_2 \quad (a7)$$

The following compounds may be mentioned as specific examples of the corresponding diene.
CH$_2$=CHCH=CH$_2$,
CH$_2$=CHCH$_2$CH=CH$_2$,
CH$_2$=CHCH$_2$CH$_2$CH=CH$_2$,
CH$_2$=CHCH$_2$CH$_2$CH$_2$CH=CH$_2$,
CH$_2$=C(CH$_3$)CH$_2$CH$_2$C(CH$_3$)=CH$_2$,
CH$_2$=CHCH$_2$CH$_2$CH$_2$CH$_2$CH=CH$_2$,
CH$_2$=CHOCH=CH$_2$,
CH$_2$=CHOCH$_2$OCH=CH$_2$,
CH$_2$=CHCH$_2$OCH$_2$CH=CH$_2$.

The above acetalization is carried out in the presence of an acid catalyst and an orthoformate, or an acid catalyst and an orthoacetate. The acid catalyst may be a Lewis acid (such as an inorganic acid such as hydrochloric acid or sulfuric acid, an organic acid such as p-toluenesulfonic acid or a solid acid such as an acid ion exchange resin). The lower limit of the reaction temperature is 0° C. and the upper limit of the reaction temperature is the lowest boiling point among boiling points of compounds to be subjected to the acetalization. In the acetalization, a formate or an acetate may form as a by-product. With the purpose of removing the by-product, at the end point of the acetalization, the reaction temperature is increased to a temperature higher than the boiling point of the by-product to gasify and discharge the by-product out of the reaction system.

The above esterification may be carried out in accordance with a known method. The reaction is carried out at a temperature of from −50° C. to 100° C. Further, in order to remove HF as a by-product, a HF scavenger such as NaF or KF is added to the reaction system, or an inert gas is made to flow in the reaction system, which HF will accompany, whereby HF will be discharged out of the reaction system.

The above fluorination in a liquid phase is carried out preferably until all the hydrogen atoms in the compound (a3) are replaced by fluorine atoms (i.e. until perfluorination). The reaction may be carried out in accordance with a method as disclosed in WO00/56694.

The above reaction of the compound (a2) with $CH_3OH$ may be carried out in accordance with a known method.

The above pyrolysis may be carried out by a method of reacting the compound (a1) with an alkali metal hydroxide so that the compound (a1) is converted to an alkali metal salt of the compound (a1), followed by pyrolysis. The alkali metal hydroxide may be NaOH or KOH. The amount of the alkali metal hydroxide is from 1.00 to 1.05 times by mol based on the compound (a1). Further, neutralization is carried out in the presence of a solvent (such as methanol, ethanol, isopropanol or t-butanol). The reaction is carried out at a temperature of from −30° C. to (the boiling point of the solvent)° C. The pyrolysis may be carried out by a known method, at a reaction temperature of from 150 to 300° C.

The compound (b) can be obtained in the same manner as in the process for producing the compound (a) except that the following compound (b1) is used instead of the compound (a6) as the raw material in the process for producing the compound (a) (wherein $Q^2$ and $Q^3$ are groups corresponding to $Q^{F2}$ and $Q^{F3}$, respectively, and each of them which are independent of each other, is a singe bond, an oxygen atom or a $C_{1-5}$ alkylene group which may have an etheric oxygen atom.

(b1)

As a process for producing the compound (cb), a process for producing the compound (cb) may be mentioned, wherein the following compound (cb5) and $CH_3COCH_2OH$ are subjected to acetalization to obtain the following compound (cb4), the resulting compound (cb4) and $F(CF_2)_3OCF(CF_3)COF$ are subjected to esterification to obtain the following compound (cb3), which is subjected to fluorination in a liquid phase to obtain the following compound (cb2), which is reacted with $CH_3OH$ to obtain the following compound (cb1m), which is hydrolyzed in a solution containing MOH to obtain compound (cb1), which is pyrolyzed to obtain the compound (cb) (in the formulae, $R^b$ is a group corresponding to $R^{Fb}$, and $R^b$ is the same group as $R^{Fb}$ or a $C_{4-14}$ alkoxyalkyl group, the same applies hereinafter).

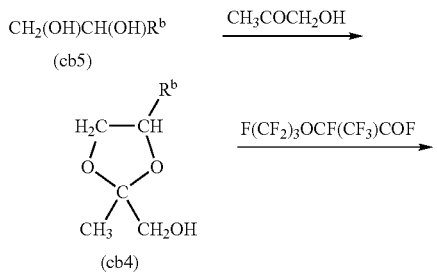

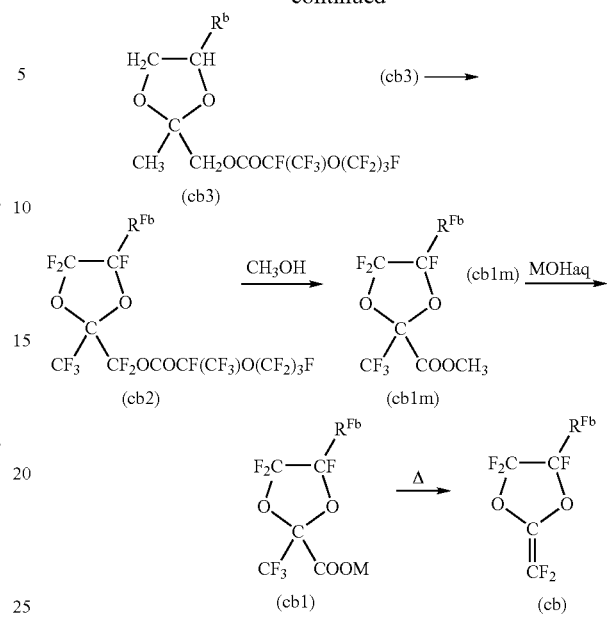

To prepare the compound (cb5), a method of oxidizing a compound represented by the formula $CH_2=CHR^b$ which is a corresponding monoene, followed by hydrolysis may be mentioned.

The following compounds may be mentioned as specific examples of the compound.

$CH_2=CHCH_2O(CH_2)_2CH_3$,
$CH_2=CHCH_2O(CH_2)_3CH_3$,
$CH_2=CHCH_2OCH(CH_3)_2$,
$CH_2=CHCH_2OCH_2CH(CH_3)_2$,
$CH_2=CHCH_2OCH(CH_3)CH_2CH_3$.

In the above production process, the acetalization, the fluorination in a liquid phase, the reaction with $CH_3OH$, the hydrolysis and the pyrolysis may be carried out under the same reaction conditions as those of the above process for producing the compound (a).

The curable composition of the present invention essentially contains the above perfluorocyclic polyene, and the perfluorocyclic polyene may be one type or two or more types. The perfluorocyclic polyene is preferably a perfluorocyclic diene. The curable composition of the present invention may contain a copolymerizable monomer other than the perfluorocyclic polyene. The copolymerizable monomer may be a monoene or a polyene, preferably a monomer having a relatively high boiling point (preferably a boiling point of at least 100° C.) and having high copolymerizability with the perfluorocyclic polyene. The copolymerizable polymer is preferably a perfluoromonomer or a chlorine-containing perfluoromonomer having some of fluorine atoms replaced with chlorine atoms. A monomer having chlorine atoms is useful e.g. in a case where it is necessary to increase the refractive index of the resulting cured fluorinated product. With a view to appropriately controlling the density of the cured fluorinated product, another copolymerizable monomer is preferably a perfluoro monoene (a perfluoro compound having one polymerizable carbon-carbon double bond), particularly preferably the above perfluorocyclic monoene with a view to maintaining optical properties.

The proportion of the perfluorocyclic polyene to the entire monomer components in the curable composition of the present invention is preferably at least 5 mass % in a case where another copolymerizable monomer is a perfluoromonomer or the above perfluoromonomer containing chlorine atoms, or at least 20 mass % in a case where another copolymerizable monomer is not a perfluoromonomer. If the proportion of the perfluorocyclic polyene is too high, the cured product may have a too high density and be a fragile cured fluorinated product in some cases. Accordingly, it is preferred to use a perfluoromonoene in combination, and in such a case, the proportion of the perfluorocyclic polyene is preferably at most 80 mass %. In a case where another copolymerizable monomer is the above perfluorocyclic monoene, the proportion of the perfluorocyclic polyene to the total amount of the perfluorocyclic polyene and the perfluorocyclic monoene is preferably from 10 to 60 mass %, particularly preferably from 20 to 50 mass %.

The curable composition of the present invention contains a polymerization initiator. The amount of the polymerization initiator in the curable composition is preferably from 0.01 to 1 mass % with a view to smoothly accelerating curing and the residue of the polymerization initiator not affecting the heat resistance and the transparency of the cured fluorinated product. The polymerization initiator is preferably an organic peroxide compatible with the perfluorocyclic monomer, particularly preferably a fluorinated organic peroxide of which the temperature at which it is halved in 10 hours is from 0 to 150° C., with a view to the residue of the polymerization initiator or the like not impairing the transparency, the light resistance, the heat resistance and the like of the cured fluorinated product.

The fluorinated organic peroxide may, for example, be a fluorinated diacyl peroxide, a fluorinated peroxydicarbonate, a fluorinated peroxyester or a fluorinated dialkyl peroxide.

As the fluorinated diacyl peroxide, the following compounds may be mentioned (in the following, $C_6F_5$ represents a perfluorophenyl group).

$(C_6F_5C(O))_2$,
$(C_6F_5C(CH_3)_2C(O))_2O$,
$(CF_3OCF_2CF_2C(O))_2O$,
$(CF_3CH_2C(O))_2O$,
$((CF_3)_2CHC(O))_2O$,
$((CF_3)_3CC(O))_2O$.

As the fluorinated peroxydicarbonate, the following compounds may be mentioned.

$((CF_3)_2CHOC(O)O)_2$,
$(CF_3(CF_2)_nCH_2OC(O)O)_2$,
$(C_6F_5OC(O)O)_2$,
$(C_6F_5CH_2OC(O)O)_2$.

As the fluorinated peroxyester, the following compounds may be mentioned.

$CF_3CF_2CH_2OOC(O)C(CF_3)_3$,
$(CF_3)_2CHOOC(O)C(CF_3)_3$,
$(CF_3)_2CHOOC(O)CH_2CF_2CF_3$,
$CF_3CF_2CHOOC(O)CH_2CF_2CF_3$,
$CF_3CF_2CHOOC(O)C_6F_5$,
$(CF_3)_2CHOOC(O)C_6F_5$.

As the fluorinated dialkyl peroxide, the following compounds may be mentioned.

$(CF_3C_6F_4C(CF_3)_2O)_2$,
$((CF_3)_3CO)_2$,
$C_6F_5C(CF_3)_2O-OC(CF_3)_3$.

The curable composition of the present invention may contain as another copolymerizable monomer a perfluoromonomer which is crosslinkable (i.e. which contains at least two polymerizable carbon-carbon double bonds) in addition to the perfluorocyclic polyene with a view to controlling physical properties of the cured fluorinated product to be obtained. The crosslinkable perfluoromonomer may replace part of the perfluorocyclic diene. In a case where the crosslinkable perfluoromonomer is used, the proportion by mass of the crosslinkable perfluoromonomer to the total amount of the crosslinkable perfluoromonomer and the perfluorocyclic polyene is preferably at most 50 mass %. It is possible to use as another copolymerizable monomer a monomer other than the perfluorocyclic monoene, such as a perfluoroalkyl vinyl ether having a boiling point of at least 100° C.

As the crosslinkable perfluoromonomer, the following compound (e) is preferred.

$$CF_2=CF-O-Q^{F4}-CF=CF_2 \tag{e}$$

In the above formula, $Q^{F4}$ is a bivalent perfluoro group which is a perfluoropolymethylene group which may have perfluoroalkyl side chains, which has from 3 to 10 perfluoromethylene groups in the perfluoropolymethylene group and which may contain an etheric oxygen atom between carbon atoms or at a side which is bonded to a carbon atom. Preferred $Q^{F4}$ is a $C_{4-10}$ perfluoropolymethylene group containing no perfluoroalkyl side chain and containing an etheric oxygen atom at a side which is bonded to a carbon atom.

The following compounds may be mentioned as specific examples of the compound (e).

$CF_2=CF-O-(CF_2)_4-O-CF=CF_2$,
$CF_2=CF-O-(CF_2)_5-O-CF=CF_2$,
$CF_2=CF-O-(CF_2)_6-O-CF=CF_2$,
$CF_2=CF-O-(CF_2)_4-CF=CF_2$.

Further, the curable composition of the present invention preferably contains a fluorinated compound (f) having a molecular weight of from 1,000 to 100,000 and compatible with the cured fluorinated product of the present invention, with a view to suppressing the volume shrinkage at the time of curing, keeping flexibility of the curable composition, etc. The amount of the fluorinated compound (f) based on the perfluorocyclic polyene in the curable composition is preferably from 5 to 30 mass %. When this amount is at least 5 mass %, an effect of suppressing the volume shrinkage of the cured product will be obtained, and when it is at most 30 mass %, favorable transparency of the cured produce will be maintained. The fluorinated compound (f) is preferably a fluoropolymer or a perfluoropolyether.

The fluoropolymer is preferably a fluorooligomer obtained by polymerizing at least one member selected from vinylidene fluoride, tetrafluoroethylene and chlorotrifluoroethylene, a liquid fluorooligomer or a crosslinked fluoropolymer containing at least one unit selected from an after-mentioned unit (A), an after-mentioned unit (B), an after-mentioned unit (C) and an after-mentioned unit (D), a non-liquid linear fluorooligomer containing at least one unit selected from an after-mentioned unit (C) and an after-mentioned unit (D), or a fluorooligomer containing a unit formed by polymerization of a perfluorocyclic monoene other than the above perfluorocyclic monoene or a unit (see JP-A-2000-1511) formed by cyclopolymerization of a cyclopolymerizable perfluorodiene.

The perfluoropolyether is preferably a perfluoropolyether containing at least one unit selected from the following repeating units.

$-(CF_2CF_2O)-$,
$-(CF_2CF(CF_3)O)-$,
$-(CF_2O)-$,
$-(CF_2CF_2CF_2O)-$,
$-(CF_2CF_2CF_2CF_2O)-$.

It is also possible to produce a cured fluorinated product by polymerization to cure the perfluorocyclic polyene or its mixture with another copolymerizable monomer without use of a polymerization initiator, instead of curing the curable composition (curable composition containing a perfluorocyclic polyene and a polymerization initiator) of the present invention. The is pefluorocyclic polyene in the process for producing a cured fluorinated product may be a monomer mixture containing the above perfluorocyclic polyene in addition to the perfluorocyclic polyene by itself. Curing by polymerization without use of a polymerization initiator may, for example, be curing by photopolymerization. In such a case, the perfluorocyclic polyene or its mixture with another copolymerizable monomer will sometimes be referred to as a curable compound or the like. As the process for producing a cured fluorinated product, more preferred is a process wherein the curing is carried out by the action of a polymerization initiator from the viewpoint of curing under moderate conditions.

The curable composition of the present invention, the curable compound or the like may contain a solvent in the form before curing, but preferably it contains substantially no solvent at the time of curing from the viewpoint of the influences of the solvent remaining in the cured fluorinated product to be obtained over various physical properties (such as light resistance) of the cured fluorinated product. It may contain, in a form before curing, a solvent used for dispersing or dissolving components other than the monomer. For example, in the case of blending the above-described fluorinated organic peroxide with the curable compound or the like, usually the fluorinated organic peroxide has a low decomposition temperature and is thereby prepared as a dispersion in a solvent such as dichloropentafluoropropane. Thus, after a composition containing the solvent is produced, the solvent is removed to obtain a curable composition containing substantially no solvent at the time of curing.

In the production process in the present invention, curing may be carried out by any known method. For example, curing by heat and/or irradiation with ultraviolet rays may be mentioned. The curable composition containing a polymerization initiator as a preferred embodiment in the production process of the present invention, is cured under moderate conditions and is thereby preferred. In such a case, the temperature at the time of curing is preferably from 0 to 200° C. Further, the temperature at the time of curing is preferably changed stepwise so that the curing proceeds stepwise, with a view to reducing the volume shrinkage accompanying the curing. Further, the curing may be carried out in a closed system or in a system not closed (open system). With the perfluorocyclic polyene of the present invention which has a high boiling point and low volatility, curing can be effectively carried out in an open system.

The curable composition, the curable compound or the like in the present invention may be adjusted to have an appropriate viscosity considering convenience at the time of its use. For example, to measure the curable is composition, the curable compound or the like (for example, at the time of encapsulating an optical element such as LED in a light-transmitting manner, the curable composition, the curable compound or the like is dispensed by a dispenser and measured), it is preferred to adjust the viscosity of the curable composition, the curable compound or the like to a level of from 100 to 1,000 cps, for easy measurement. This adjustment may be carried out e.g. by a method of blending the above compound (e) or fluorinated compound (f) as a viscosity-adjusting agent or a method of increasing the viscosity by partially curing the curable composition, the curable compound or the like.

The cured fluorinated product which is a cured product of the curable composition, the curable compound or the like in the present invention is, in a case where the perfluorocyclic monomer is the compound (a), a cured fluorinated product containing a unit represented by the following formula (A) (wherein $Q^{F1}$ is as defined above).

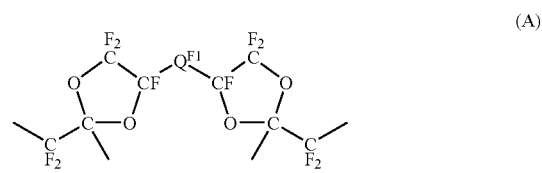

(A)

Similarly, in a case where the perfluorocyclic monomer is the compound (b), it is a cured fluorinated product containing a unit represented by the following formula (B), in a case where the monomer is the compound (c), it is a cured fluorinated product containing a unit represented by the formula (C), and in a case where the monomer is the compound (d), it is a cured fluorinated is product containing a unit represented by the following formula (D) (wherein $Q^{F2}$, $Q^{F3}$, $R^{F1}$, $R^{F2}$, $R^{F3}$ and $R^{F4}$ are as defined above).

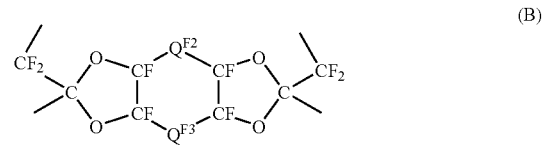

(B)

(C)

(D)

The cured fluorinated product in the present invention has high light resistance (particularly durability against a short wavelength light) and transparency, has a high glass transition point and is excellent in heat resistance. Accordingly, the cured fluorinated product in the present invention is useful as an optical material.

Namely, the present invention provides an optical material made of the above cured fluorinated product. The application of the optical material may, for example, be a core material or a cladding material for an optical fiber, a core material or a cladding material for an optical waveguide, a pellicle material, a surface protective material for a display (such as PDP, LCD, FED or organic EL), a surface protective material for a lens (such as a condensing lens for a light emitting device, an artificial crystalline lens, a contact lens or a low refractive index lens), a material for a lens (such as a condensing lens for a light emitting device, an artificial crystalline lens, a contact lens or a low refractive index lens), or an encapsulating material for a device (such as a light emitting device, a solar battery device or a semiconductor device).

The optical material of the present invention is used preferably as a molded product made of a cured fluorinated product having an optional shape (such as a plate, a tube or a bar) formed by curing the curable composition, the curable compound or the like of the present invention in a mold having an optional shape, or a coating film of the cured fluorinated product encapsulating an optional substrate (such as the above-mentioned display, lens or device) in a light-transmitting manner formed by curing the curable composition, the curable compound or the like of the present invention on the optional substrate.

The molded product is preferably a core and/or cladding material for an optical fiber, a core and/or cladding material for an optical waveguide, or a material for a lens.

The coating film is preferably an encapsulating material for a device, such as an encapsulating material for encapsulating a semiconductor device, a solar battery device or a light emitting device (such as LED, laser LED or electroluminesence device) in a light-transmitting manner, particularly preferably an encapsulating material for encapsulating a short wavelength light emitting device in a light-transmitting manner, from the viewpoint of the cured fluorinated product in the present invention having the above properties. The short wavelength light emitting device may be white LED.

Namely, the present invention provides a light emitting device encapsulated with the optical material of the present invention in a light-transmitting manner. In a case where the light emitting device of the present invention is a short wavelength light emitting device, a phosphor for emission wavelength conversion of LED may be added to the curable composition, the curable compound or the like of the present invention as the case requires.

In FIG. 1, one example of the optical device of the present invention is shown. FIG. 1 is a partial cross-section illustrating the short wavelength light emitting device. The structure of the short wavelength light emitting device may be a chip type as shown in FIG. 1 or may be a shell type. The short wavelength light emitting device in FIG. 1 comprises a housing 4 made of a heat resistant resin or a metal and conductive lead frames 5 and 6, an LED chip 1 is bonded on an inner lead of the lead frame 5 by means of a die bonding agent such as a conductive paste, an electrode on the upper portion and the LED chip 1 and an inner lead of the lead frame 6 are connected by means of a bonding wire 3 and conduction is permitted therebetween, and the entire structure is encapsulated with an encapsulating resin 2 in a light-transmitting manner. A cured product of the curable composition of the present invention is used for the encapsulating resin 2. Light emitted from the LED chip 1 is transmitted through the encapsulating resin 2 and exits out of the optical device. The encapsulation in a light-transmitting manner means encapsulation with an encapsulating resin through which light is transmitted in such a manner.

EXAMPLES

Now, the present invention will be specifically described with reference to Examples, but the present invention is not limited to such specific Examples. R-113 represents 1,1,2-trichloro-1,2,2-trifluoroethane, and $R^f$— represents a group represented by $F(CF_2)_3OCF(CF_3)CF$—. GC represents gas chromatography, and GC-MS represents gas chromatography mass spectrometery. The GC purity is a purity determined from the peak area ratio in GC analysis. The pressure is represented by absolute pressure unless otherwise specified.

Example 1

Synthesis Example

Example for Preparation of Compound (a1m-1)

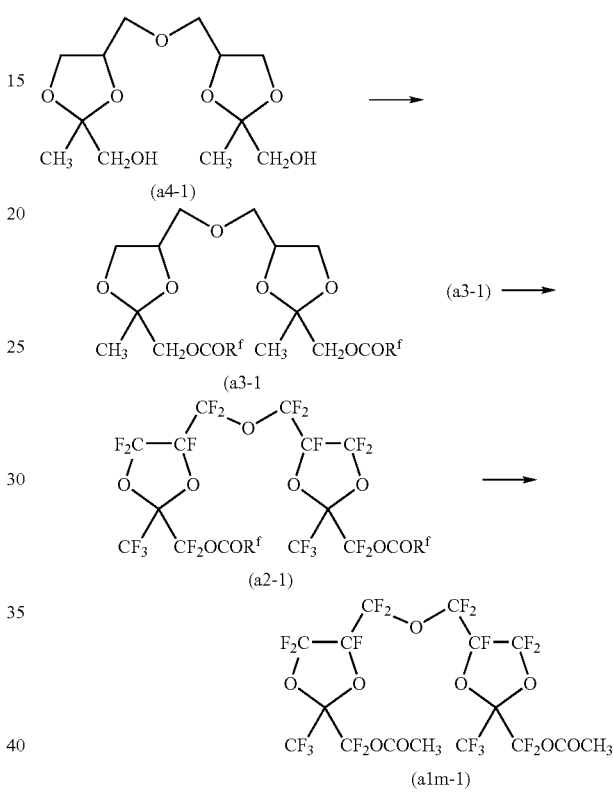

Example 1-1

Example for Preparation of Compound (a4-1) and Compound (a3-1)

$CH_3COCH_2OH$ (59 g), $CH_2(OH)CH(OH)CH_2OCH_2CH(OH)CH_2OH$ (60 g), methyl orthoformate (84.3 g) and p-toluenesulfonic acid (3.1 g) were put in a flask (internal capacity 1 L) and heated at 80° C. for 3 hours with stirring. Then, the pressure in the flask was reduced to 2.5 mbar to remove methanol and methyl formate as low boiling point components, whereby a reaction solution containing the title compound (a4-1) (155 g) with M/e of 278 with a GC purity at a level of 65% by GC-MS was obtained. Then, NaF (91 g) was added to the reaction solution with stirring under cooling with ice, and then a compound (240 g) represented by the formula $R^f$—COF was dropwise added over a period of 2 hours. Stirring was carried out further for 2 hours, and stirring was carried out at 25° C. for 12 hours to obtain a reaction crude liquid. The reaction crude liquid was purified by means of silica gel column employing a developing solvent of methyl acetate/hexane=1/2 (mass ratio), followed by distillation under reduced pressure to obtain the title compound (a3-1) (205 g) with a GC purity of 99% as a distillate at 2 mbar/173 to 176° C.

Example 1-2

Example for Preparation of Compound (a2-1)

R-113 (1,700 g) was put in an autoclave (internal capacity 3,000 mL, made of nickel) and stirred, and the temperature in the autoclave was kept at 25° C. At the gas outlet of the autoclave, a condenser kept at 20° C., a NaF pellet packed bed and a condenser kept at −10° C. were installed in series. Further, a liquid return line was installed which returns a condensed liquid to the autoclave from the condenser kept at −10° C. A nitrogen gas was blown to the autoclave at room temperature for one hour and then a fluorine gas (hereinafter referred to as a 20% fluorine gas) diluted to 20% with a nitrogen gas was further blown at room temperature at a flow rate of 17.04 L/h. Then, while the 20% fluorine gas was blown at the same flow rate, a solution having the compound (a3-1) (110 g) obtained in Example 1-1 dissolved in R-113 (800 g) was injected over a period of 24 hours.

Then, while the 20% fluorine gas was blown at the same flow rate, the pressure in the autoclave was increased to 0.15 MPa, 30 mL of an R-113 solution at a benzene concentration of 0.01 g/mL was injected while the temperature was increased from 25° C. to 40° C., the benzene solution inlet of the autoclave was closed, and stirring was continued for 0.3 hours.

Then, while the pressure in the autoclave was kept at 0.15 MPa and the temperature in the autoclave was kept at 40° C., 20 mL of the above benzene solution was injected, the benzene solution inlet of the autoclave was closed, and stirring was continued for 0.3 hour. Further, 20 mL of R-113 was supplied so that the entire benzene solution in the pipeline was injected in the autoclave. The total amount of benzene injected was 0.5 g, and the total amount of R-113 injected was 49 mL.

Further, while the 20% fluorine gas was blown to the autoclave at the same flow rate, stirring was continued for one hour. Then, the pressure in the autoclave was recovered to normal pressure, and a nitrogen gas was blown for one hour. The product was analyzed by $^{19}$F-NMR and as a result, formation of the title compound (a2-1) with a yield of 92% was confirmed. The $^{19}$F-NMR spectrum of the compound (a2-1) is shown below.

$^{19}$F-NMR (282.7 MHz, solvent: CDCl$_3$, standard: CFCl$_3$) δ (ppm): −77.8 (2F), −80.5 (8F), −81.1 to −83.7 (18F), −86.0 to −88.0 (6F), −122.4 (2F), −130.2 (4F), −132.2 (2F).

Example 1-3

Synthesis Example

Example for Preparation of Compound (a1m-1)

Methanol (140 g) was put in a bottle (internal capacity 500 mL, made of polyethylene), and the compound (a2-1) (140 g) obtained in Example 1-2 was dropwise added thereto with stirring under cooling with ice. After completion of the dropwise addition, stirring was carried out at 25° C. for 12 hours to obtain a crude liquid. Low boiling point components in the crude liquids were distilled off by means of a rotary evaporator, followed by washing with water three times to obtain the title compound (a1m-1) (67 g) with a GC purity of 92%. The $^{19}$F-NMR spectrum of the compound (a1m-1) is shown below.

$^{19}$F-NMR (282.65 MHz, solvent: CDCl$_3$, standard: CFCl$_3$) δ (ppm): −78.3 and −83.8 (4F), −81.5 (6F), −82 to −84 (4F), −123.6 (2F).

Example 2

Synthesis Example

Example for Preparation of Compound (a-1)

The compound (a1m-1) (22 g) obtained in Example (1-3) and phenolphthalein were put in an Erlenmeyer flask, and 167 g of a solution of KOH/methanol=1/5 (mass ratio) was dropwise added at 25° C. with stirring to obtain a solution colored red. Methanol was distilled off from the solution by means of a rotary evaporator, followed by vacuum drying to 100° C. for one day to obtain a solid substance (28 g).

Then, the solid substance was put in a flask (internal capacity 100 mL) and heated to from 250 to 280° C. while the pressure was reduced by a vacuum pump. A pyrolyzate generated as a gas was collected in a trap tube cooled with a dry ice/ethanol. The collected liquid was analyzed by GC-MS and as a result, it contained the following compounds (a-1) to (a-5). M/e of the compound (a-1) was 466 (purity 63%), M/e of the compound (a-2) was 544, M/e of the compound (a-3) was 532, M/e of the compound (a-4) was 486, and M/e of the compound (a-5) was 504.

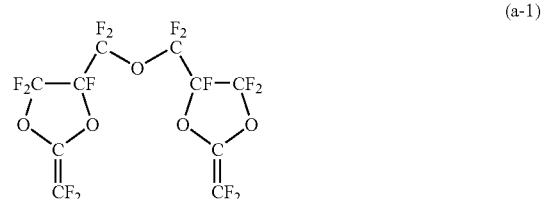
(a-1)

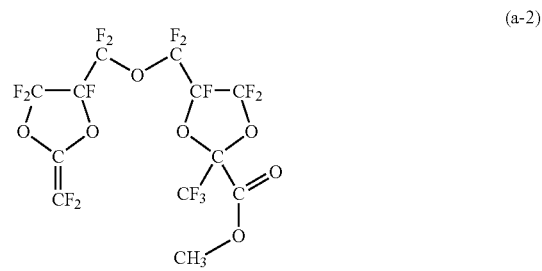
(a-2)

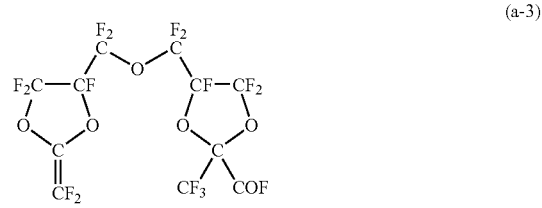
(a-3)

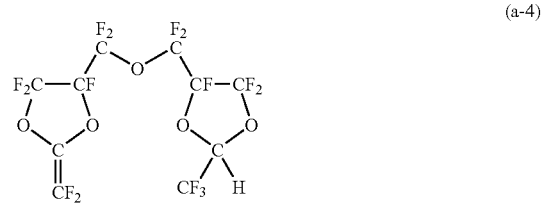
(a-4)

-continued

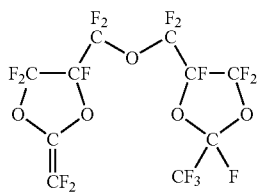

(a-5)

The compound (a-3) was converted to a methyl ester to obtain the compound (a-2), and then the mixture was subjected to distillation to isolate the compound (a-1) and the compound (a-2). The distillate at 44° C./5 mbar contained 94% of the compound (a-1). The distillate further contained 0.5% of the compound (a-2), 4.8% of the compound (a-4) and 0.4% of the compound (a-5). Further, the distillate at 69° C./2 mbar contained 97% of the compound (a-2) and 0.1% of the compound (a-4).

The $^{19}$F-NMR spectrum and the $^{13}$C-NMR spectrum of the compound (a-1) are shown below.

$^{19}$F-NMR (564.55 MHz, solvent: CDCl$_3$,standard: CFCl$_3$) δ (ppm): −80 to −84 (4F), −82.8 and −88.3 (4F), −126.0 and −127.3 (4F), −128.8 (2F).

$^{19}$C-NMR (150.80 MHz, solvent and standard: CDCl$_3$) δ (ppm): 104.9, 116.4, 122.2, 133.8, 142.9.

Example 3

Synthesis Example

Example for Preparation of Compound (cb1)

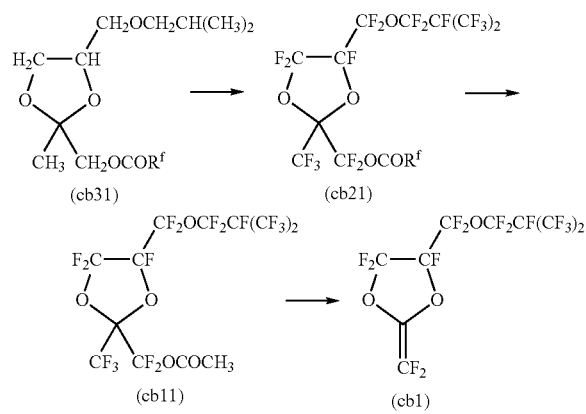

Example 3-1

Synthesis Example

Example for Preparation of Compound (cb31)

The compound represented by the formula R$^f$—COF was reacted with a compound obtained by subjecting CH$_2$(OH)CH(OH)CH$_2$OCH$_2$CH(CH$_3$)$_2$ and CH$_3$COCH$_2$OH to acetalization to obtain the title compound.

Example 3-2

Synthesis Example

Example for Preparation of Compound (cb11)

In the same manner as in Example 1-2 except that the compound (cb31) was used instead of the compound (a-1), the compound (cb31) was subjected to fluorination in a liquid phase to obtain the compound (cb21).

Then, the compound (cb21) (161 g) was put in a flask (internal capacity 200 mL) under cooling with ice, and then CH$_3$OH (21 g) was dropwise added thereto with nitrogen bubbling while the temperature in the flask was kept at 0° C. After completion of the dropwise addition, stirring was carried out at 25° C. for 20 hours to obtain a reaction crude liquid. The reaction crude liquid was washed with water 5 times and dehydrated over anhydrous magnesium sulfate, followed by filtration, and the obtained filtrate was subjected to distillation under reduced pressure to obtain the title compound (cb11) (69 g) with a GC purity of 79%.

Example 3-3

Synthesis Example

Example for Preparation of Compound (cb1)

The compound (cb11) (68 g) and phenolphthalein were put in a flask (internal capacity 300 mL) under cooling with ice, and a methanol solution containing 20 mass % of potassium hydroxide was dropwise added to the flask with stirring until the solution in the flask colored red. The total amount of the methanol solution dropwise added was 71 g. Then, the solution in the flask was concentrated and vacuum dried at 100° C. for 38 hours to obtain a solid substance (68 g).

Then, the solid substance (67 g) was put in a flask (internal capacity 200 mL) equipped with a trap tube kept at −78° C., and the interior of the flask was heated at from 150 to 380° C. under reduced pressure, and the liquid distilled off was collected in trap tube. The obtained liquid (46 g) was analyzed and as a result, formation of the title compound (cb1) was confirmed.

$^{19}$F-NMR of compound (cb1) (282.65 MHz, solvent: CDCl$_3$, standard: CFCl$_3$) δ (ppm): −74.0 (6F) , −77.5 (2F), −81.5 to 84.5 (3F), −88.3 (1F), −126.5 (2F), −128.7 (1F), −188.0 (1F).

Example 4

Example of the Present Invention

Example for Preparation of Transparent Resin A

A composition comprising the compound (a-1) (3 g) obtained in Example 2, the following compound (c-1) (7 g) and (C$_6$F5C(O)O)$_2$ (20 mg) was prepared. The composition was heated at 60° C. for one hour to obtain a syrup having a viscosity of from 100 to 200 cps.

A frame comprising an O-ring (inner diameter: 20 mm, thickness: 2 mm, made of fluororubber) fixed to a slide glass by means of an epoxy adhesive was prepared. The syrup (1 g) was poured into the mold, and a slide glass was overlaid thereon. The slide glass was heated at 60° C. for 5 hours, and further heated at 70° C. for 5 hours, at 100° C. for 2 hours and at 120° C. for 2 hours in this order. After the mold was cooled, the O-ring and the slide glass were removed to obtain a disk-shape transparent cured product (diameter: 20 mm, thickness: 0.5 mm). The cured product was further vacuum dried at 120° C. for 24 hours to obtain a transparent resin A. The transparent resin A had a light transmittance of 94% to a light having a wavelength of 400 nm. Further, the transparent resin A was irradiated with. light from a 1 kW high-pressure mercury lamp for one hour at an ambient temperature of 80° C. and as a result, the appearance and the light transmittance to a light having a wavelength of 400 nm of the transparent resin A did not change.

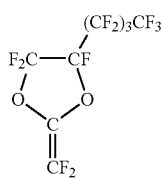

(c-1)

Example 5

Example of the Present Invention

Example for Preparation of Transparent Resin B

A transparent resin B (0.48 g) was obtained in the same manner as in Example 4 except that a composition comprising the compound (a-1) (3 g) obtained in Example 2, the compound (c-1) (6 g), a chlorotrifluoroethylene oligomer (1 g, the number average molecular weight of about 700) and $(C_6F_5C(O)O)_2$ (20 mg) was poured into the mold. The transparent resin B had a light transmittance to a light having a wavelength of 400 nm of 94%. Further, the transparent resin B was irradiated with light from a 1 kW high-pressure mercury lamp for one hour at an ambient temperature of 80° C. and as a result, the appearance and the light transmittance to a light having a wavelength of 400 nm of the transparent resin B did not change.

Example 6

Example of the Present Invention

Example for Preparation of Transparent Resin C

A composition comprising a compound (a-1) (3 g) obtained in Example 2, the following compound (c-2) (7 g) and $(C_6F_5C(O)O)_2$ (20 mg) was prepared. The composition was heated at 60° C. for one hour to obtain a syrup having a viscosity of from 100 to 200 cps.

A frame comprising an O-ring (inner diameter: 20 mm, thickness: 2 mm, made of fluororubber) fixed to a slide glass by means of an epoxy adhesive was prepared. The syrup (1 g) was poured into the mold, and a slide glass was overlaid thereon. The slide glass was heated at 60° C. for 5 hours, and further heated at 70°0 C. for 5 hours and at 120° C. for 2 hours in this order. After the mold was cooled, the O-ring and the slide glass were removed to obtain a disk-shape transparent cured product (diameter: 20 mm, thickness: 0.5 mm). The cured product was further vacuum dried at 120° C. for 24 hours to obtain a transparent resin C. The transparent resin C had a light transmittance of 94% to a light having a wavelength of 400 nm. Further, the transparent resin C was irradiated with light from a 1 kW high-pressure mercury lamp for one hour at an ambient temperature of 80° C. and as a result, the appearance and the light transmittance to a light having a wavelength of 400 nm of the transparent resin C did not change.

Further, the transparent resin C was irradiated with light from a 1 kW high-pressure mercury lamp, of which light having a wavelength of at most 300 nm was shut off, for 1,000 hours at an ambient temperature of from 150 to 170° C. The appearance of the transparent resin C after irradiation did not change at all, and the light transmittance to a light having a wavelength of 400 nm was at least 90%.

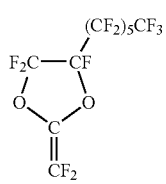

(c-2)

Example 7

Example of the Present Invention

Example for Preparation of Transparent Resin D

A curable composition comprising 3 parts of the compound (a-1) obtained in Example 2, 7 parts of the compound (cb1) obtained in Example 3 and 0.02 part of $(C_6F_5C(O)O)_2$ is prepared. Then, the curable composition is heated at 60° C. for 1 hour to obtain a syrup having a viscosity of from 100 to 200 cps. A transparent cured product (diameter: 20 mm, thickness: 0.5 mm) is obtained in the same manner as in Example 4 except that this syrup is used. Further, the cured product is vacuum dried at 120° C. for 24 hours to obtain a transparent resin D.

The transparent resin D is irradiated with light from a 1 kW high-pressure mercury lamp, of which light having a wavelength of at most 300 nm is shut off, for 1,000 hours at an ambient temperature of from 150 to 170° C. The appearance of the transparent resin C after irradiation does not change at all, and the light transmittance to a light having a wavelength of 400 nm is at least 90%.

Example 8

Comparative Example

Example (No. 1) for Preparation of Non-fluorinated Cured Product

A transparent cured resin is obtained in the same manner as in Example 4 except that the composition in Example 4 is changed to a composition comprising a bisphenol A type epoxy resin (1 part, Epikote 828 manufactured by Japan Epoxy Resins Co., Ltd.), methylcyclohexanedicarboxylic anhydride (0.85 part, HN5500 manufactured by Hitachi Chemical Company Ltd.) and a trace amount of 2-ethyl-4-methylimidazole (manufactured by ACROS) and that a slide glass, the surface of which is made to be hydrophobic with an alkoxysilane, is used.

The transparent cured resin is slightly yellow as visually observed, and has a light transmittance to a light having a wavelength of 400 nm of 92%. Further, the transparent cured resin is irradiated with light from a 1 kW high-pressure mercury lamp for 1 hour at an ambient temperature of 80° C. and as a result, the transparent cured resin is deep yellow as visually observed, and its light transmittance to a light having a wavelength of 400 nm decreases to 75%.

Further, the transparent cured resin is irradiated with light from a 1 kW high-pressure mercury lamp, of which light having a wavelength of at most 300 nm is shut off, at an ambient temperature of from 150 to 170° C. 30 Minutes after initiation of the irradiation, the transparent cured resin is colored brown and does not transmit light having a wavelength of 400 nm at all.

Example 9

Comparative Example

Example (No. 2) for Preparation of Non-fluroniated Cured Product

A silicone resin (KR-251 manufactured by Shin-Etsu Chemical Co., Ltd.) was irradiated with light from a 1 kW high-pressure mercury lamp, of which light having a wavelength of at most 300 nm was shut off, for 800 hours at an ambient temperature of from 150 to 170° C. The silicone resin after irradiation had cracks and became fragile, and its light transmittance decreased to a level of 50%.

Example 10

Comparative Example

Example for Preparation of Solution Type Fluorinated Coating Film

An amorphous fluoropolymer solution (Cytop CTL-817 NMX, manufactured by Asahi Glass Company, Limited, solid content concentration 17%) is poured in the same mold as in Example 4, followed by drying to vaporize the solvent, whereby a transparent resin is obtained. Drying is carried out at 90° C. for one hour and further at 120° C. for 5 hours. This operation is repeated so as to increase the thickness, whereupon cracks form at a second or third drying.

Example 11

Example of the Present Invention

Example for Preparation of Light Transmitting Device Encapsulated with Cured Fluorinated Product in a Light-transmitting Manner A curable composition comprising 30 parts of the compound (a-1), 30 parts of the compound (a-2), 40 parts of the compound (c-1) and 0.2 part of $(C_6F_5C(O)O)_2$ was heated with stirring at 60° C. for 30 minutes to prepare a curable composition having a viscosity of several hundred cps.

The curable composition was dropwise added on an LED (high-luminance LED having an emission wavelength of 405 nm) surface treated with 3-aminopropyltrimethoxysilane in an amount sufficient to cover the LED. Then, the system was heated at 60° C. for one hour, at 80° C. for one hour and at 100° C. for three hours in this order to obtain an LED encapsulated with a cured fluorinated product obtained by curing the curable composition in a light-transmitting manner. The LED emitted light by applying electricity (voltage: 4.3 V, current: 40 mA). Further, even after exposure to states at −40° C. and at 120° C. each 200 times, it emitted light under the same conditions of application of electricity.

INDUSTRIAL APPLICABILITY

The curable composition provided by the present invention can form a cured fluorinated product with a high reaction yield even when cured in an open system. Further, the cured fluorinated product in the present invention is excellent in transparency, light resistance (particularly durability to a short wavelength light) and heat resistance and is thereby useful as an optical material, particularly a material for a lens and an encapsulating material for a device (particularly a light emitting device (short wavelength light emitting device such as white LED)).

The entire disclosure of Japanese Patent Application No. 2004-063990 filed on Mar. 8, 2004 including specification, claims, drawings and summary is incorporated herein by reference in its entirety.

What is claimed is:

1. A curable composition which contains a perfluorocyclic polyene having alicyclic structures which comprise carbon atoms and which may contain an oxygen atom and having at least two carbon-carbon double bonds, at least one of which is a polymerizable carbon-carbon double bond in which at least one of the two carbon atoms forming the polymerizable carbon-carbon double bond is a carbon atom forming the alicyclic structure; and a polymerization initiator.

2. The curable composition according to claim 1, wherein the perfluorocyclic polyene is a perfluorocyclic diene which has alicyclic structures comprising a 5-membered or 6-membered ring containing one or two oxygen atoms, in which a carbon-carbon double bond is present between adjacent two carbon atoms constituting the alicyclic structure or a carbon-carbon double bond is present between one carbon atom constituting the alicyclic structure and a carbon atom outside the alicyclic structure, and which has two alicyclic structures having such a carbon-carbon double bond.

3. The curable composition according to claim 1, which further contains a perfluorocyclic monoene having at least 8 carbon atoms, having an alicyclic structure which comprises carbon atoms and which may contain an oxygen atom, and having one polymerizable carbon-carbon double bond in which at least one of the two carbon atoms forming the polymerizable carbon-carbon double bond is a carbon atom forming the alicyclic structure.

4. The curable composition according to claim 3, wherein the perfluorocyclic monoene is a perfluorocyclic monoene which has an alicyclic structure comprising a 5-membered or 6-membered ring containing one or two oxygen atoms, and in which a carbon-carbon double bond is present between adjacent two carbon atoms constituting the alicyclic structure or a carbon-carbon double bond is present between one carbon atom constituting the alicyclic structure and a carbon atom outside the alicyclic structure.

5. An optical material made of a cured fluorinated product obtained by curing the curable composition as is defined in claim 1.

6. A light emitting device encapsulated with a cured fluorinated product obtained by curing the curable composition as defined in claim 1 in a light-transmitting manner.

7. A process for producing a cured fluorinated product, which comprises curing a perfluorocyclic polyene having alicyclic structures which comprise carbon atoms and which may contain an oxygen atom and having at least two carbon-carbon double bonds, at least one of which is a polymerizable carbon-carbon double bond in which at least one of the two carbon atoms forming the polymerizable carbon-carbon double bond is a carbon atom forming the alicyclic structure, or the perfluorocyclic polyene and a copolymerizable monomer other than the perfluorocyclic polyene.

8. The process for producing a cured fluorinated product according to claim 7, wherein the curing is carried out by the action of a polymerization initiator.

9. An optical material made of a cured fluorinated product obtained by the process as defined in claim 7.

10. A light emitting device encapsulated with a cured fluorinated product obtained by the process as defined in claim 7 in a light-transmitting manner.

\* \* \* \* \*